United States Patent
Tajima

(10) Patent No.: US 9,478,213 B2
(45) Date of Patent: Oct. 25, 2016

(54) ACOUSTIC WAVE DEVICE BUILT-IN MODULE AND COMMUNICATION DEVICE

(71) Applicant: TAIYO YUDEN CO., LTD., Tokyo (JP)

(72) Inventor: Motoyuki Tajima, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 721 days.

(21) Appl. No.: 13/903,760

(22) Filed: May 28, 2013

(65) Prior Publication Data

US 2014/0003196 A1    Jan. 2, 2014

(30) Foreign Application Priority Data

Jun. 28, 2012 (JP) ................................ 2012-145819

(51) Int. Cl.
| | |
|---|---|
| H03H 9/25 | (2006.01) |
| H01L 41/09 | (2006.01) |
| H02N 2/00 | (2006.01) |
| G10K 11/18 | (2006.01) |
| H03H 9/05 | (2006.01) |
| H03H 9/10 | (2006.01) |

(52) U.S. Cl.
CPC ............ *G10K 11/18* (2013.01); *H03H 9/0547* (2013.01); *H03H 9/1092* (2013.01); *H01L 2924/0002* (2013.01)

(58) Field of Classification Search
USPC ............. 310/313 R, 313 A–313 D, 340, 348; 333/187–194
See application file for complete search history.

(56) References Cited

U.S. PATENT DOCUMENTS

| | | | |
|---|---|---|---|
| 5,281,883 A | 1/1994 | Ikata et al. | |
| 5,977,628 A | 11/1999 | Moriga | |
| 6,927,649 B2 | 8/2005 | Metzger et al. | |
| 7,352,105 B2 | 4/2008 | Mori et al. | |
| 7,913,367 B2 | 3/2011 | Tsuda | |
| 7,999,632 B2 | 8/2011 | Iwamoto | |
| 2003/0169575 A1* | 9/2003 | Ikuta et al. | ............. 361/761 |
| 2007/0252481 A1 | 11/2007 | Iwamoto et al. | |

(Continued)

FOREIGN PATENT DOCUMENTS

| | | |
|---|---|---|
| JP | 55-093238 A | 7/1980 |
| JP | 04-170811 A | 6/1992 |

(Continued)

OTHER PUBLICATIONS

Japanese Office Action dated Jun. 25, 2013, in a counterpart Japanese patent application No. 2012-145819.

(Continued)

*Primary Examiner* — Thomas Dougherty
(74) *Attorney, Agent, or Firm* — Chen Yoshimura LLP

(57) ABSTRACT

An acoustic wave device built-in module includes: a multilayer wiring board formed by stacking an insulating layer and a wiring layer; an acoustic wave device embedded in the multilayer wiring board; and an electronic component located on the multilayer wiring board and electrically coupled to the acoustic wave device, wherein the acoustic wave device includes: an electrode that is located on a substrate and excites an acoustic wave; and a sealing portion that includes a frame body located on the substrate so as to surround the electrode and a lid located on the frame body so as to form an air space above the electrode, and the lid is recessed toward the substrate.

12 Claims, 15 Drawing Sheets

(56) References Cited

U.S. PATENT DOCUMENTS

| | | |
|---|---|---|
| 2010/0225202 A1 | 9/2010 | Fukano et al. |
| 2010/0277035 A1 | 11/2010 | Kudo et al. |
| 2011/0037170 A1* | 2/2011 | Shinohara ............... 257/737 |
| 2011/0158134 A1* | 6/2011 | Mikhemar et al. ......... 370/277 |
| 2012/0086309 A1 | 4/2012 | Yamaji et al. |
| 2013/0099628 A1 | 4/2013 | Inoue et al. |
| 2013/0257221 A1 | 10/2013 | Yamaji et al. |
| 2013/0321102 A1 | 12/2013 | Iwaki |
| 2014/0118093 A1 | 5/2014 | Yamashita |
| 2014/0354114 A1 | 12/2014 | Moriya et al. |
| 2014/0368084 A1 | 12/2014 | Fukano et al. |

FOREIGN PATENT DOCUMENTS

| | | | | |
|---|---|---|---|---|
| JP | 06-188326 A | | 7/1994 | |
| JP | 07-045735 A | | 2/1995 | |
| JP | 11-055062 A | | 2/1999 | |
| JP | 2000-165192 A | | 6/2000 | |
| JP | 2000-261284 A | | 9/2000 | |
| JP | 2001-244638 A | | 9/2001 | |
| JP | 2002-208650 A | | 7/2002 | |
| JP | 2003-142981 A | | 5/2003 | |
| JP | 2003-198204 A | | 7/2003 | |
| JP | 2003-282763 A | * | 10/2003 | ............. H01L 23/04 |
| JP | 2004-356911 A | * | 12/2004 | ............... H03B 5/32 |
| JP | 2007-173750 A | * | 12/2005 | ............. H01L 23/02 |
| JP | 2006-351590 A | | 12/2006 | |
| JP | 2007-208665 A | | 8/2007 | |
| JP | 2007-258776 A | | 10/2007 | |
| JP | 2007-312107 A | | 11/2007 | |
| JP | 2007-312108 A | | 11/2007 | |
| JP | 2009-225118 A | | 10/2009 | |
| JP | 2012-070098 A | | 4/2012 | |
| JP | 5358724 B1 | * | 12/2013 | ............. G10K 11/18 |
| WO | 2009/057699 A1 | | 5/2009 | |
| WO | 2009/090895 A1 | | 7/2009 | |

OTHER PUBLICATIONS

Japanese Office Action dated Aug. 25, 2015, in a Japanese divisional application No. 2013-179701 of a counterpart Japanese patent application No. 2012-145819.
Chinese Office Action dated Sep. 6, 2015, in a counterpart Chinese patent application No. 201310258524.6.
Taiwanese Office Action dated Oct. 19, 2015, in a counterpart Taiwanese patent application No. 102119984.
U.S. Appl. No. 14/063,144, filed Oct. 25, 2013.

* cited by examiner

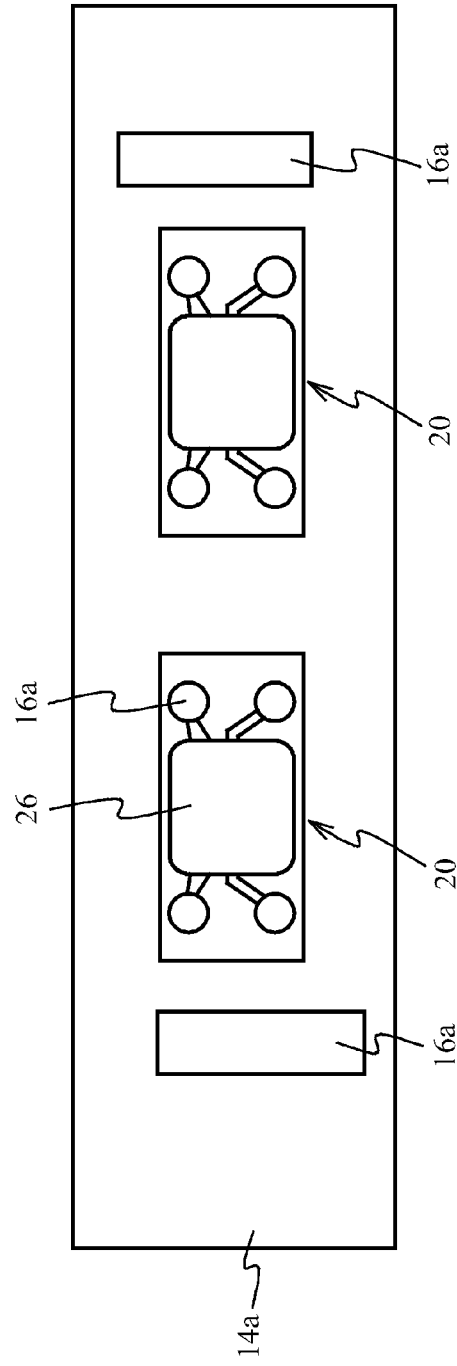
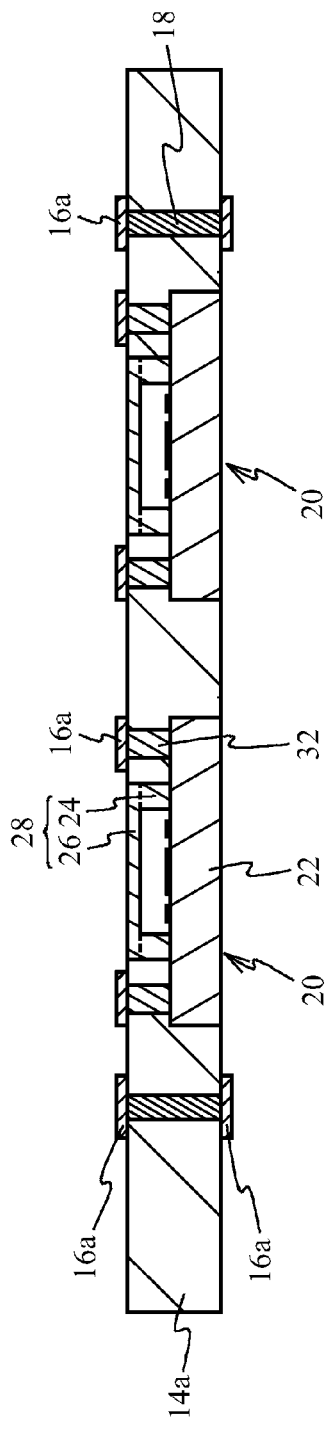
FIG. 6A
FIG. 6B

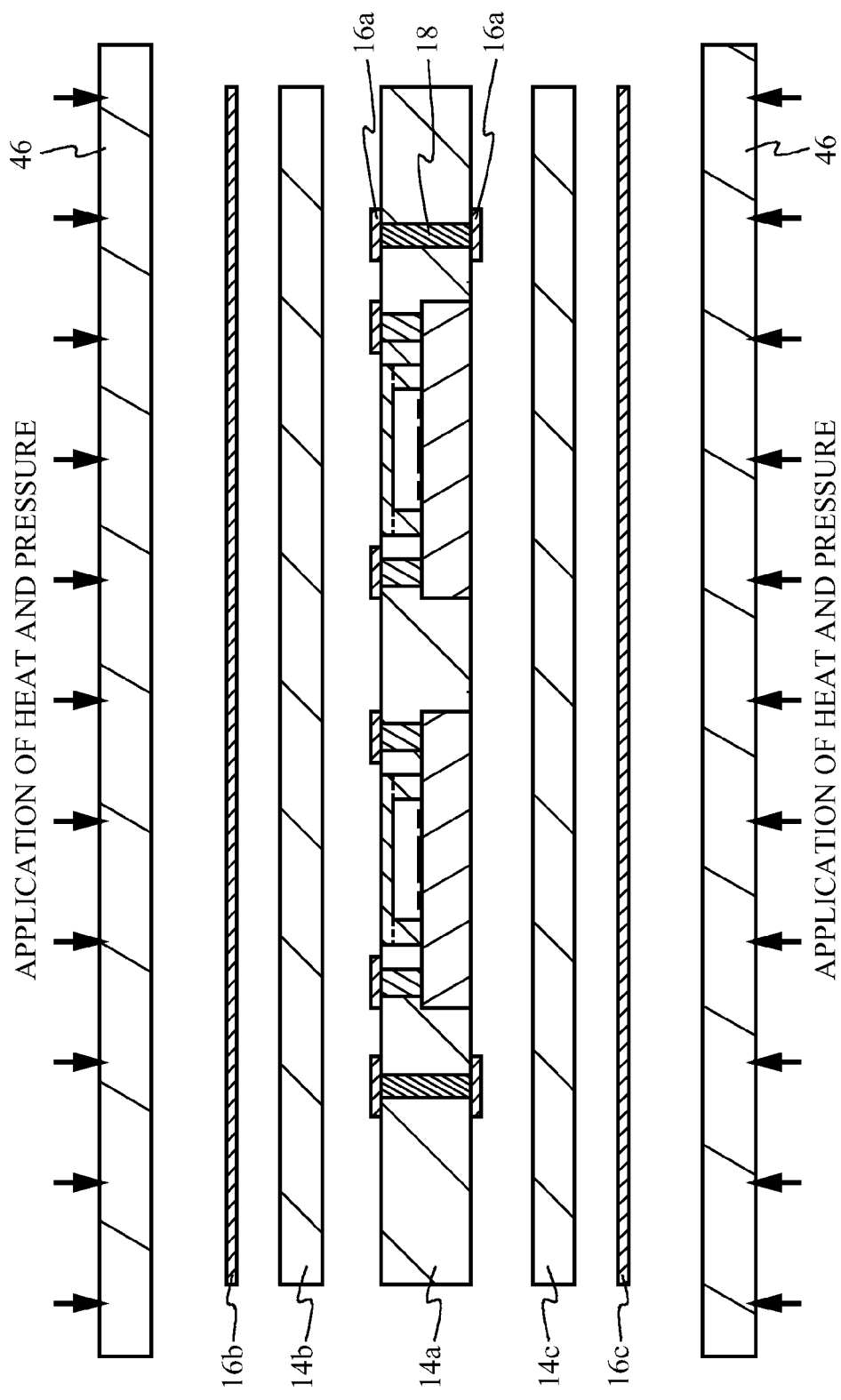

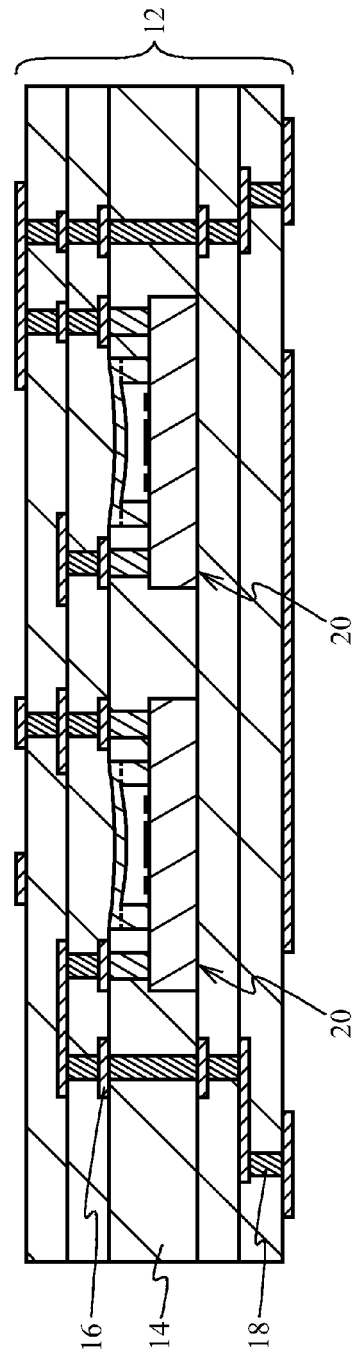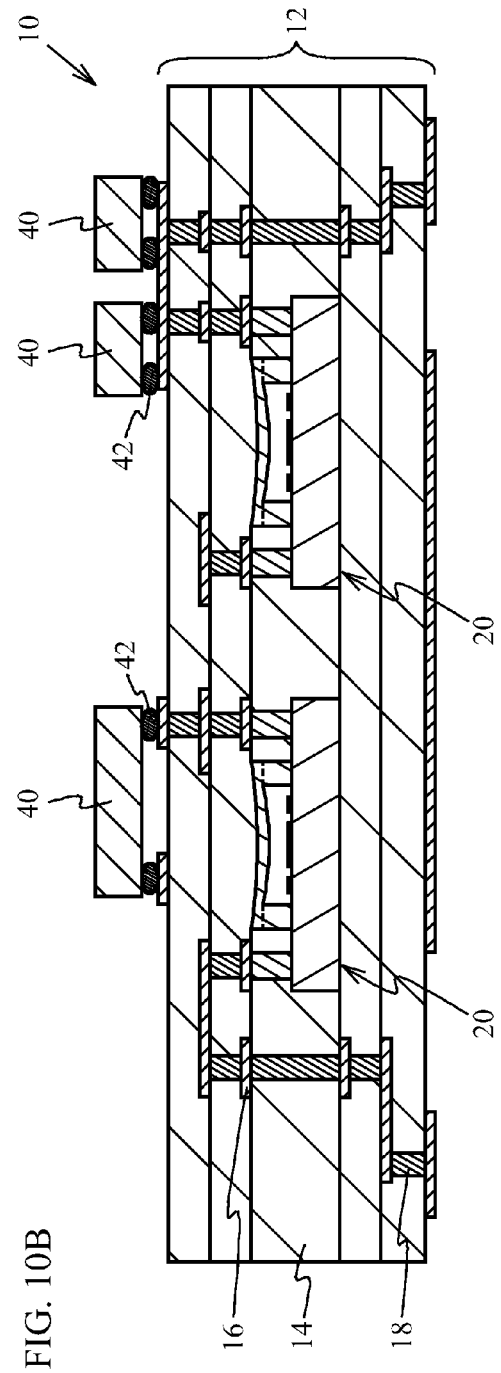

ACOUSTIC WAVE DEVICE BUILT-IN MODULE AND COMMUNICATION DEVICE

CROSS-REFERENCE TO RELATED APPLICATION

This application is based upon and claims the benefit of priority of the prior Japanese Patent Application No. 2012-145819, filed on Jun. 28, 2012, the entire contents of which are incorporated herein by reference.

FIELD

A certain aspect of the present invention relates to an acoustic wave device built-in module and a communication device.

BACKGROUND

Acoustic wave devices using an acoustic wave are used for filters and duplexers in wireless communication devices such as mobile phone terminals. The acoustic wave devices include surface acoustic wave devices using a surface acoustic wave and bulk wave devices using a bulk wave. The surface acoustic wave device has a comb-shaped IDT (Interdigital Transducer) electrode formed on a piezoelectric substrate. The surface acoustic wave devices include Love wave devices or boundary acoustic wave devices including a dielectric film covering an IDT electrode. On the other hand, the bulk wave devices include piezoelectric thin film resonator devices including electrodes sandwiching the upper and lower surfaces of a piezoelectric film. In addition, the bulk wave devices also include Lamb wave devices using a Lamb wave.

The acoustic wave device includes a sealing portion that has an air space (space) above an electrode exciting an acoustic wave (IDT electrode formed on a piezoelectric substrate, or a pair of electrodes arranged on the upper and lower surfaces of a piezoelectric film so as to overlap each other in its thickness direction) in order to maintain its characteristics.

Wireless communication devices have been downsized, and thus modules into which acoustic wave devices are installed have been required to be downsized. There has been known that an acoustic wave device is located in a multilayer wiring board formed by stacking a wiring layer such as a metal and an insulating layer such as a resin to downsize and thin the module (e.g. Japanese Patent Application Publication No. 2006-351590). On the other hand, there has been known that moisture or an unreacted substance in a resin vaporizes and is emitted when the resin is heated (e.g. Japanese Patent Application Publication No. 2007-258776).

Moisture or the like penetrates into an air space (space) above an electrode exciting an acoustic wave even when the electrode is sealed by a sealing portion in an acoustic wave device built-in module including an acoustic wave device embedded in a multilayer wiring board formed by staking a wiring layer and an insulating layer. This erodes the electrode exciting the acoustic wave, and degrades characteristics as the acoustic wave device. In addition, when the acoustic wave device built-in module is mounted on the motherboard of an electronic device or the like, the moisture that has penetrated into the electrode exciting the acoustic wave vaporizes and expands because of application of heat in mounting, applies stress on the acoustic wave device, and may cause a crack.

SUMMARY OF THE INVENTION

According to an aspect of the present invention, there is provided an acoustic wave device built-in module including: a multilayer wiring board formed by stacking an insulating layer and a wiring layer; an acoustic wave device embedded in the multilayer wiring board; and an electronic component located on the multilayer wiring board and electrically coupled to the acoustic wave device, wherein the acoustic wave device includes: an electrode that is located on a substrate and excites an acoustic wave; and a sealing portion that includes a frame body located on the substrate so as to surround the electrode and a lid located on the frame body so as to form an air space above the electrode, and the lid is recessed toward the substrate.

According to another aspect of the present invention, there is provided a communication device including the above described acoustic wave device built-in module.

BRIEF DESCRIPTION OF THE DRAWINGS

FIG. 6A is a plan view illustrating the method of fabricating the acoustic wave device built-in module of the first embodiment, and FIG. 6B is a cross-sectional view (No. 2) illustrating the method of fabricating the acoustic wave device built-in module of the first embodiment;

FIG. 7 is a cross-sectional view (No. 3) illustrating the method of fabricating the acoustic wave device built-in module of the first embodiment;

FIG. 10A and FIG. 10B are cross-sectional views (No. 6) illustrating the method of fabricating the acoustic wave device built-in module of the first embodiment;

DETAILED DESCRIPTION

Figure 1:
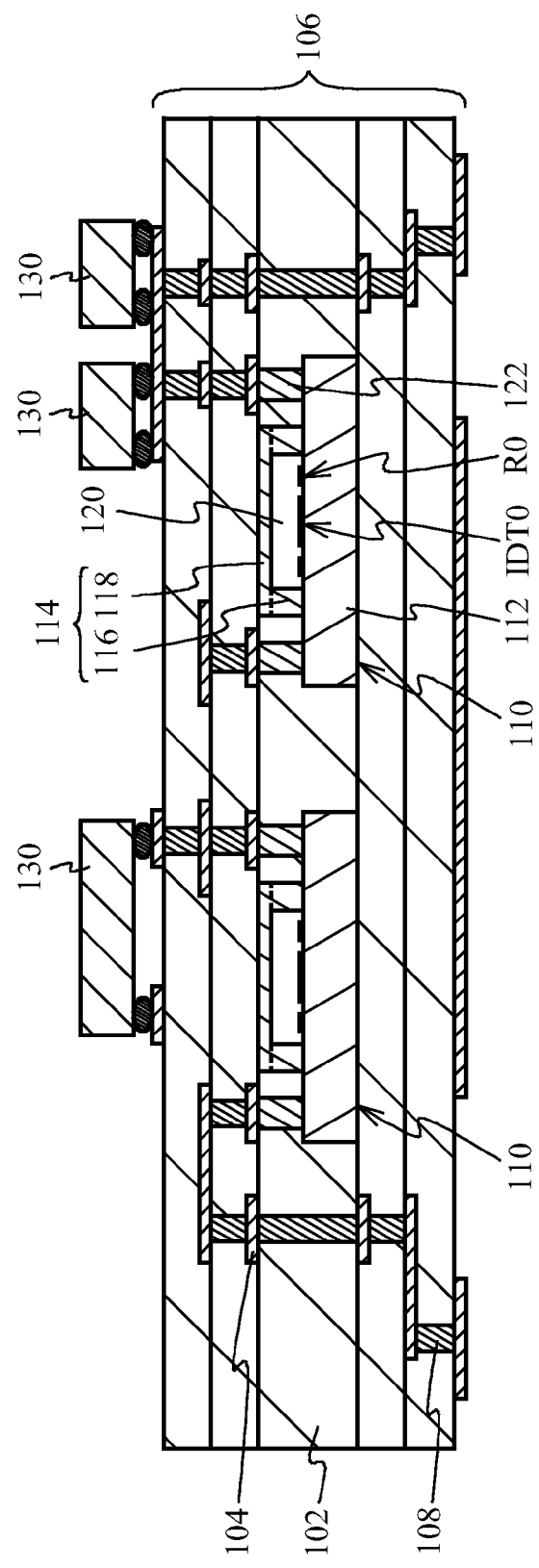
FIG. 1 is a cross-sectional view illustrating an acoustic wave device built-in module in accordance with a first comparative example.

FIG. 1 is a cross-sectional view illustrating an acoustic wave device built-in module in accordance with a first comparative example. As illustrated in FIG. 1, the acoustic wave device built-in module of the first comparative example includes acoustic wave devices 110 embedded in a multilayer wiring board 106 formed by stacking insulating layers 102 and wiring layers 104. The wiring layers 104 stacked through the insulating layers 102 are electrically coupled to each other by penetrating wiring (interlayer connecting wiring) 108 that extends in the thickness direction of the insulating layer 102. Electronic components 130 such as an inductor, a capacitor, and a high frequency IC (Integrated Circuit) are mounted on the surface of the multilayer wiring board 106.

The acoustic wave device 110 is a surface acoustic wave device including a comb-shaped IDT (Interdigital Transducer) electrode IDT0 formed on a piezoelectric substrate 112 and reflectors R0 located at both sides thereof. In addition, a sealing portion 114 that is made of a metal and seals the IDT0 and the reflectors R0 is formed on the piezoelectric substrate 112. The sealing portion 114 includes a frame body 116 surrounding the IDT0 and the reflectors R0 and a lid 118 formed on the frame body 116 so that an air space 120 is formed above the IDT0. Protrusion electrodes 122 for electrically connecting the IDT0 to the outside are located on the piezoelectric substrate 112 around the sealing portion 114. The protrusion electrodes 122 are configured to be capable of electrically connecting to the electronic components 130 through the wiring layers 104 and/or penetrating wiring (interlayer connecting wiring) 108.

As illustrated in FIG. 1, when the acoustic wave device 110 is located inside the multilayer wiring board 106, moisture penetrates into the air space (space) 120 above the IDT0 and erodes the IDT0, and thereby characteristics of the acoustic wave device 110 easily degrade. The moisture penetrates during a fabrication process of the acoustic wave device built-in module, or penetrates because of deterioration with age after the formation of the acoustic wave device built-in module. In addition, the moisture penetrates into the air space 120 from a boundary face such as the boundary face between the piezoelectric substrate 112 and the frame body 116, or the boundary face between the frame body 116 and the lid 118. For example, when an insulating layer is located between wiring and the frame body 116 so that the wiring connecting the IDT0 to the protrusion electrode 122 is electrically insulated from the frame body 116, moisture penetrates from the boundary face between the insulating layer and the frame body 116. Especially, when the insulating layer 102 is formed of an epoxy resin, a polyimide resin, or a thermoplastic liquid crystal polymer sheet, resin has a hygroscopic property, and thus moisture easily penetrates into the air space 120.

The sealing portion 114 is formed by bonding the frame body 116 to the lid 118 with, for example, solder, and the bonding is performed in an environment at higher temperature than the melting point of solder. Thus, the pressure inside the air space decreases if the volume of the air space 120 is constant when the temperature comes into normal temperature from high temperature. As described above, the decompressed state inside the air space 120 helps moisture penetrate into the air space 120. Further, when the insulating layer 102 is formed of a resin, moisture and/or an unreacted substance (e.g. fluorine or chlorine) vaporizes and is emitted from the insulating layer 102 because of the heat applied for mounting the acoustic wave device built-in module on the motherboard of an electronic device. At this point, moisture and/or an unreacted substance produced in the insulating layer 102, which is an internal layer of the multilayer wiring board 106, is not discharged to the outside, and retained in the multilayer wiring board 106. Therefore, deterioration with age causes the above described moisture and/or unreacted substance to penetrate into the air space 120.

As described above, in the acoustic wave device built-in module including the acoustic wave device embedded in the multilayer wiring board, moisture or the like penetrates into the air space above the electrode exciting the acoustic wave in the acoustic wave device, and thereby characteristics of the acoustic wave device degrade. Thus, hereinafter, a description will be given of embodiments capable of preventing moisture or the like from penetrating into the air space located above the electrode exciting the acoustic wave to solve the above described problems.

First Embodiment

Figure 2:
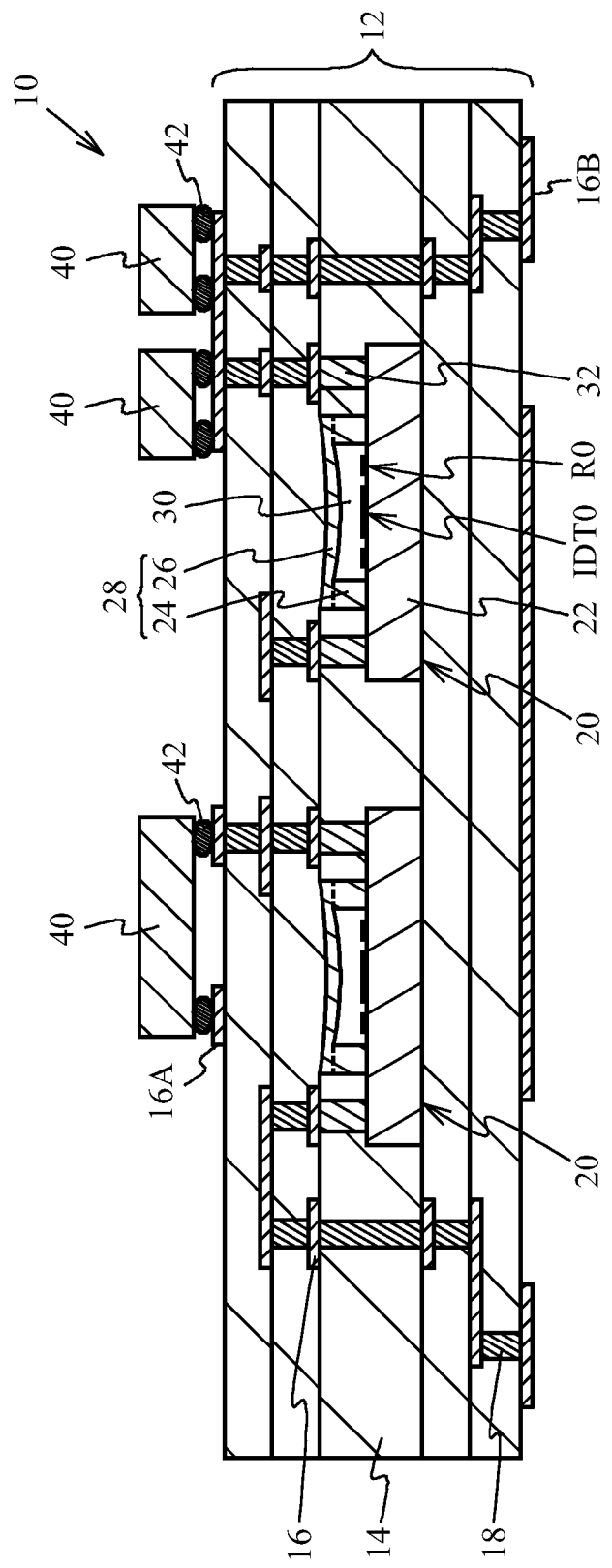
FIG. 2 is a cross-sectional view illustrating an acoustic wave device built-in module in accordance with a first embodiment.

FIG. 2 is a cross-sectional view illustrating an acoustic wave device built-in module in accordance with a first embodiment. As illustrated in FIG. 2, acoustic wave devices 20 are embedded in the inside of a multilayer wiring board 12 in an acoustic wave device built-in module 10 of the first embodiment. The acoustic wave devices 20 are housed and arranged so as to be positioned at almost the center portion of the multilayer wiring board 12 in its thickness direction. The multilayer wiring board 12 is a multilayered substrate formed by stacking insulating layers 14 and wiring layers 16. The stacked wiring layers 16 are electrically coupled to each other by penetrating wiring (interlayer connecting wiring) 18 that penetrates through the insulating layers 14. The wiring layers 16 and the penetrating wiring 18 are formed of a metal such as copper (Cu). On the other hand, the insulating layers 14 are formed of an epoxy resin, a polyimide resin, or a thermoplastic liquid crystal polymer sheet, for example.

Figure 3A:
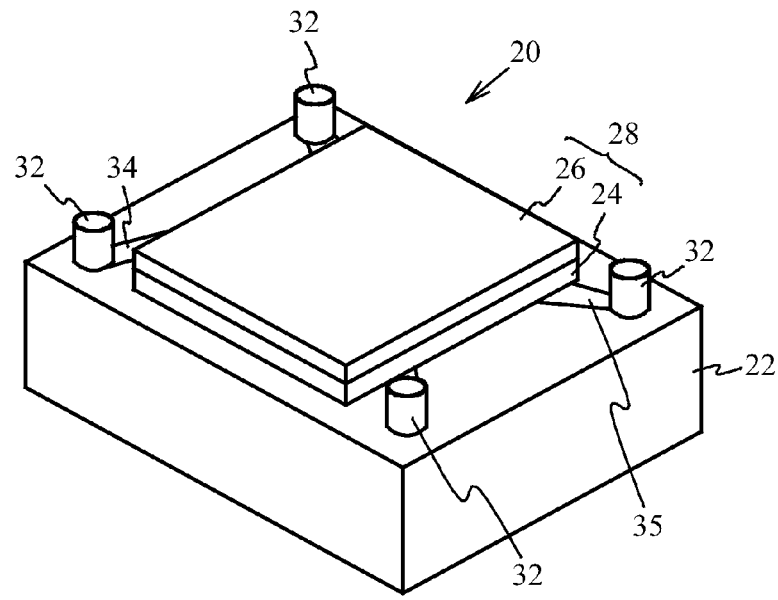
FIG. 3A is an external perspective view illustrating one acoustic wave device embedded in the acoustic wave device built-in module illustrated in FIG. 2.
Figure 3B:
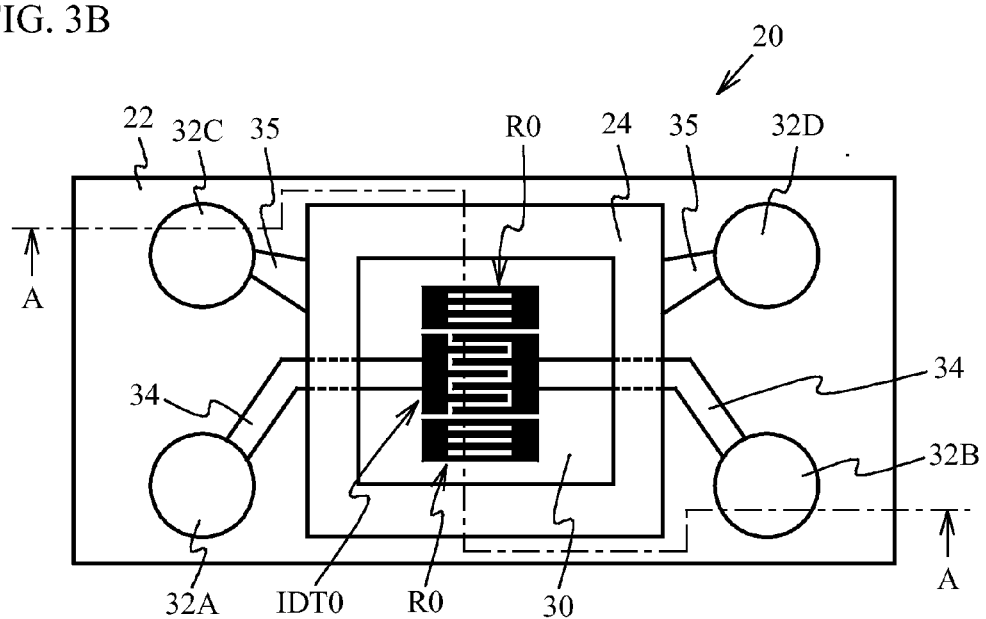
FIG. 3B is a plan view illustrating a configuration of the acoustic wave device by transparently illustrating a lid illustrated in FIG. 3A.

Here, a description will be given of the acoustic wave devices 20 housed and embedded in the acoustic wave device built-in module 10. FIG. 3A is an external perspective view illustrating one acoustic wave device 20 embedded in the acoustic wave device built-in module illustrated in FIG. 2, and FIG. 3B is a plan view illustrating a configuration of the acoustic wave device 20 by transparently illustrating a lid 26 illustrated in FIG. 3A. Here, omitted is the illustration of the insulating layer 14 and the wiring layer 16 located around the acoustic wave device 20. As illustrated in FIG. 3A and FIG. 3B, the acoustic wave device 20 is a surface acoustic wave device including the IDT0 and the reflectors R0 located at both sides of the IDT0 on a substrate 22 (hereinafter, referred to as a piezoelectric substrate) made of a piezoelectric material such as lithium tantalate ($LiTaO_3$) or lithium niobate ($LiNbO_3$). The piezoelectric substrate 22 has a thickness of, for example, 250 μm. The IDT0 and the reflectors R0 are formed of a metal such as aluminum (Al). FIG. 3B only illustrates one IDT0 and the reflectors R0 located at both sides thereof, but a desired circuit such as a filter circuit is formed by the combination of acoustic wave device elements including the IDT0 and the reflectors R0 in the acoustic wave device.

A frame body 24 having a planar shape of approximate rectangle is located on the piezoelectric substrate 22 so as to surround the IDT0 and the reflectors R0. The frame body 24 is formed of a metal including, for example, Cu or nickel (Ni), and has a thickness of, for example, 30 μm. The plate-like lid 26 covering the IDT0 and the reflectors R0 is located on the frame body 24 so that an air space 30 is formed above the IDT0 and the reflectors R0. The lid 26 is formed of a metal plate including, for example, Cu or Ni, and has a thickness of, for example, 20 μm. This configuration allows the IDT0 and the reflectors R0 to be sealed in the air space 30 formed by a sealing portion 28 composed of the frame body 24 and the lid 26.

Four protrusion electrodes 32 are located on the upper surface of the piezoelectric substrate 22 outside the sealing portion 28. A protrusion electrode 32A of the four protrusion electrodes 32 is used for inputting a signal, and another protrusion electrode 32B is used for outputting a signal. Further, two protrusion electrodes 32C and 32D are used for grounding. The signal input protrusion electrode 32A and the signal output protrusion electrode 32B are electrically coupled to the IDT0 through wiring 34. An insulating layer (not illustrated) is located between the wiring 34, which is coupled to the signal input protrusion electrode 32A and the signal output protrusion electrode 32B, and the frame body 24, and the wiring 34 is electrically insulated from the frame body 24. On the other hand, the grounding protrusion electrodes 32C and 32D are electrically coupled to the frame body 24 through wiring 35. That is to say, the acoustic wave device 20 shields the IDT0 and the reflectors R0 from external electromagnetical field by the frame body 24 and the lid 26.

Figure 4:
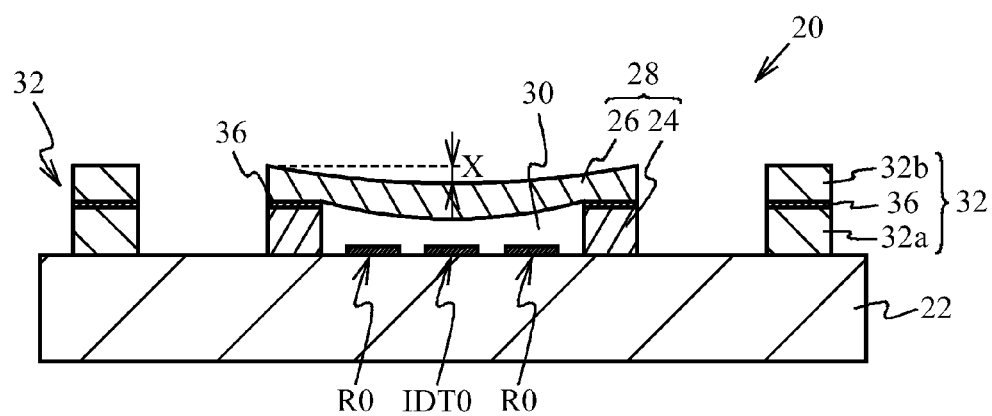
FIG. 4 is a cross-sectional view taken along line A-A in FIG. 3B.

FIG. 4 is a cross-sectional view taken along line A-A in FIG. 3B. As illustrated in FIG. 4, each of the protrusion electrodes 32 includes a lower columnar portion 32a, an upper columnar portion 32b, and a connecting member 36 located between the columnar portions and made of gold (Au)-tin (Sn) solder. On the other hand, the frame body 24 and the lid 26 constituting the sealing portion 28 are interconnected with the connecting member 36 made of gold (Au)-tin (Sn) solder. In the acoustic wave device 20 located inside the acoustic wave device built-in module 10 of the first embodiment, the upper surface of the lid 26 is not flat, and curves more toward the piezoelectric substrate 22 at greater distances from the frame body 24 (is recessed more toward a direction approaching to the surface of the piezoelectric substrate). That is to say, the volume of the air space (space) 30 located above the IDT0 and the reflectors R0 decreases with the deformation of the lid 26 toward the surface of the piezoelectric substrate 22. The curving amount X of the lid 26 is less than a half of its thickness, and a minimum gap between the lid 26 and the IDT0 is secured so as to be greater than or equal to 10 μm. Moreover, the perspective view of FIG. 3A omits the illustration of the curve.

In FIG. 2, the protrusion electrodes 32 included in the acoustic wave device 20 embedded in the multilayer wiring board 12 are coupled to the wiring layer 16 and the penetrating wiring 18. At least a part of a wiring layer 16A formed on the upper surface of the multilayer wiring board 12 is used as a terminal pad, and electronic components 40 are mounted on the terminal pads with solder 42. The electronic component 40 is a chip component such as a resistive element, inductor, or capacitor, or an active element such as a power amplifier, antenna switch, or high frequency IC, and mounted on the terminal pad as necessary. The above described configuration electrically couples the acoustic wave devices 20 to the electronic components 40. In addition, the acoustic wave devices 20 and the electronic components 40 are electrically coupled to a wiring layer 16B formed on the lower surface of the multilayer wiring board 12 as necessary. The wiring layer 16B on the lower surface of the multilayer wiring board 12 functions as a terminal pad for external connection for the acoustic wave device built-in module 10. That is to say, the acoustic wave devices 20 and the electronic components 40 are electrically coupled to terminals on the motherboard of an electronic device through the wiring layer 16B on the lower surface of the multilayer wiring board 12.

Figure 5A:
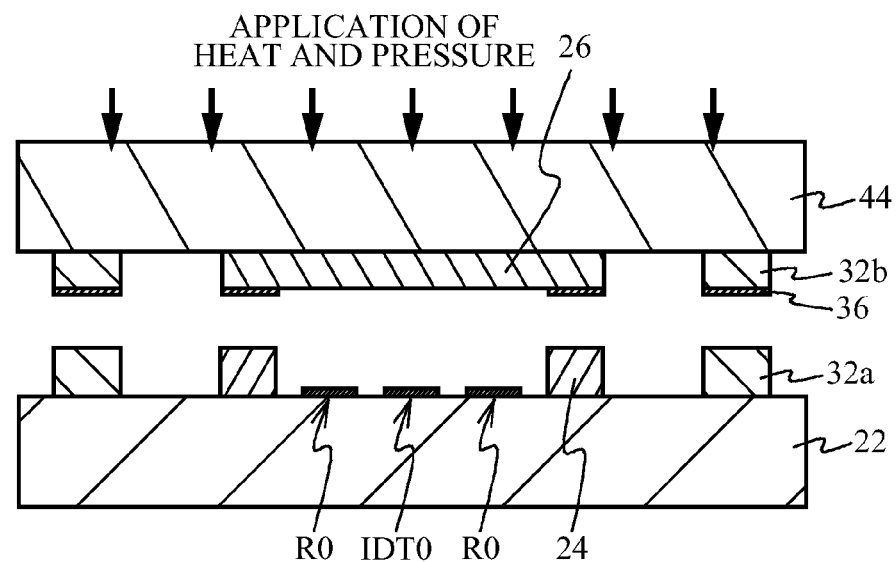
FIG. 5A and FIG. 5B are cross-sectional views (No. 1) illustrating a method of fabricating the acoustic wave device built-in module of the first embodiment.
Figure 5B:
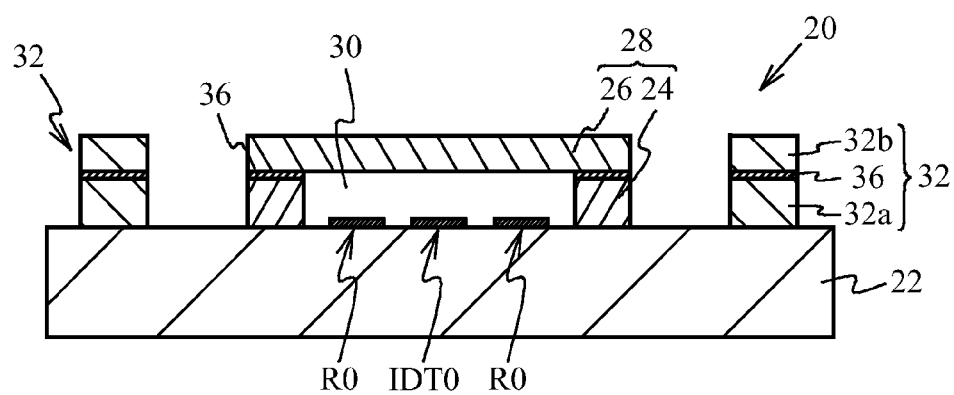

A description will next be given of a method of fabricating the acoustic wave device built-in module of the first embodiment. FIG. 5A and FIG. 5B and FIG. 6B through FIG. 10B are cross-sectional views illustrating the method of fabricating the acoustic wave device built-in module of the first embodiment. FIG. 6A is a plan view illustrating the method of fabricating the acoustic wave device built-in module of the first embodiment. Referring to FIG. 5A and FIG. 5B, a description will first be given of the method of fabricating the acoustic wave device to be embedded in the acoustic wave device built-in module of the first embodiment. As illustrated in FIG. 5A, on the piezoelectric substrate 22, formed are the IDT0, the reflectors R0, the frame body 24 surrounding the IDT0 and the reflectors R0, and the lower portions 32a of the protrusion electrodes 32 located outside the frame body 24 by well-known techniques. The IDT0 and the reflectors R0 can be formed by vapor deposition of a metal mainly including aluminum and liftoff, for example. The frame body 24 and the lower portions 32a of the protrusion electrodes 32 can be formed by selectively depositing a metal mainly including copper by electrolytic plating.

In parallel with the forming of the metal layer on the piezoelectric substrate 22, the lid 26 and the upper portions 32b of the protrusion electrodes 32 are selectively formed on a support substrate 44 made of stainless steel such as SUS304 (downward in FIG. 5). Then, the connecting members 36 made of, for example, gold (Au)-tin (Sn) solder are formed on edge portions of the upper surface of the lid 26 and the upper surfaces of the upper portions 32b of the protrusion electrodes 32. The lid 26, the upper portions 32b of the protrusion electrodes 32, and the connecting members 36 can be formed by electrolytic plating for example.

The support substrate 44 is, then, located on the piezoelectric substrate 22 so that the lid 26 faces the frame body 24 and the upper portions 32b of the protrusion electrodes 32 face the lower portions 32a. The connecting members 36 are heated to a temperature higher than the melting point of the connecting member 36 (e.g. 250 to 300° C.), and the support substrate 44 is pressed toward the piezoelectric substrate 22.

This process bonds the lid 26 to the frame body 24 through the connecting member 36, and the sealing portion 28 having the air space 30 above the IDT0 and the reflectors R0 is formed as illustrated in FIG. 5B. In addition, the lower portions 32a and the upper portions 32b of the protrusion electrodes 32 are bonded to each other by the connecting members 36 to form the protrusion electrodes 32. Then, the support substrate 44 is removed to form the sealing portion 28 having the air space 30 above the IDT0 and the reflectors R0, and the acoustic wave device 20 including two or more protrusion electrodes 32 located around the sealing portion 28 is formed. At this point, the surface of the lid 26 is flat. On the other hand, the connecting member 36 is melted under high temperature environment to bond the frame body 24 to the lid 26, and thus the pressure inside the air space 30 decreases when the temperature comes back from high temperature to normal temperature, and the pressure inside the air space 30 is lower than the outside atmospheric pressure.

The lid 26 preferably includes Cu to achieve high heat release performance and low electric resistance, and a Ni layer is preferably formed on the Cu layer to reduce the non-uniformity of the thickness. In addition, the support substrate 44 is preferably made of a material such as SUS304 that functions as a base for plating Cu and has adhesiveness to the extent that it can be easily removed from the lid 26 after sealing. Further, a piezoelectric material same as that of the piezoelectric substrate 22 may be used for the support substrate 44 to reduce positional misalignment due to a difference in thermal expansion coefficient. When a piezoelectric substance is used for the support substrate 44, a first metal layer for electrolytic plating (e.g. Al layer or Cu layer) is preferably formed on the surface of the support substrate 44, and a second metal layer with an appropriate adhesiveness (e.g. Ti layer) is preferably further formed on the first metal layer.

The acoustic wave device 20 formed through the above described fabrication process is embedded in an insulating layer 14a including the penetrating wiring 18 formed so as to pierce the upper and lower surfaces and a wiring layer 16a selectively formed on the both surfaces as illustrated in FIG. 6A and FIG. 6B. At this point, the upper surface of the acoustic wave device 20 is preferably exposed to the upper surface of the insulating layer 14a, and at least the upper surface of the lid 26 forms the same plane as the upper surface of the insulating layer 14a.

Figure 8A:
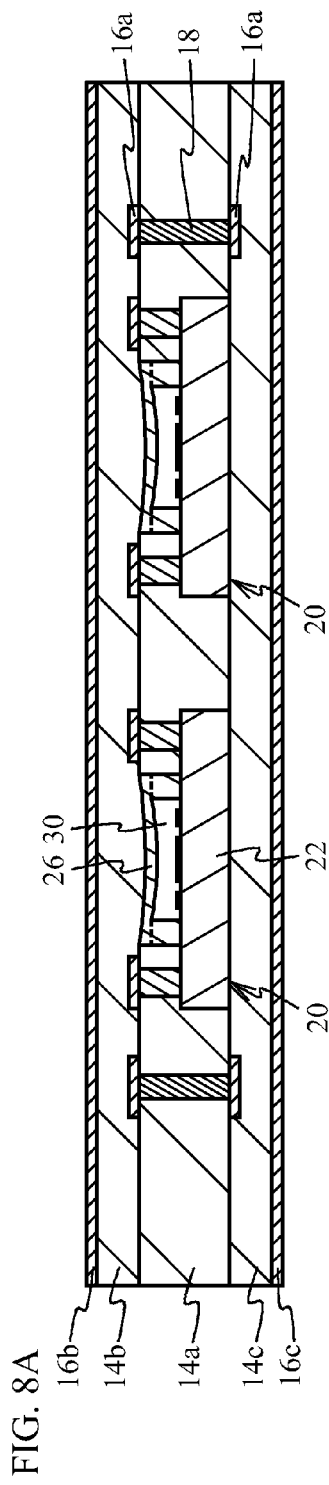
FIG. 8A through FIG. 8C are cross-sectional views (No. 4) illustrating the method of fabricating the acoustic wave device built-in module of the first embodiment.

As illustrated in FIG. 7, a prepreg insulating layer 14b and wiring layer 16b are then sequentially located at the upper surface side of the insulating layer 14a while a prepreg insulating layer 14c and wiring layer 16c are sequentially located at the lower surface side of the insulating layer 14a. Then, the insulating layers 14b and 14c and the wiring layers 16b and 16c are heated, and the insulating layers 14b and 14c and the wiring layers 16b and 16c are pressed toward the insulating layer 14a with supports 46. This bonds the insulating layers 14b and 14c and the wiring layers 16b and 16c to the insulating layer 14a, and the multilayered substrate in which the acoustic wave device 20 is embedded is obtained as illustrated in FIG. 8A. At this point, the pressure applied to the insulating layers 14b and 14c and the wiring layers 16b and 16c is also applied to the acoustic wave device 20, and thus the material and thickness of the lid 26 are properly selected so that the lid 26 curves toward the piezoelectric substrate 22 (is recessed toward a direction approaching the surface of the piezoelectric substrate 22). When the lid 26 is recessed toward the direction approaching the surface of the piezoelectric substrate 22, the volume of the air space 30 becomes small, and the pressure inside the air space 30 becomes greater than the pressure when the lid 26 is flat before the embedding into the insulating layer 14a. The recessed amount of the lid 26 depends on its material and thickness, and thus the material and the thickness of the lid 26 are preliminarily selected so as to achieve a desired recessed amount.

Figure 8B:
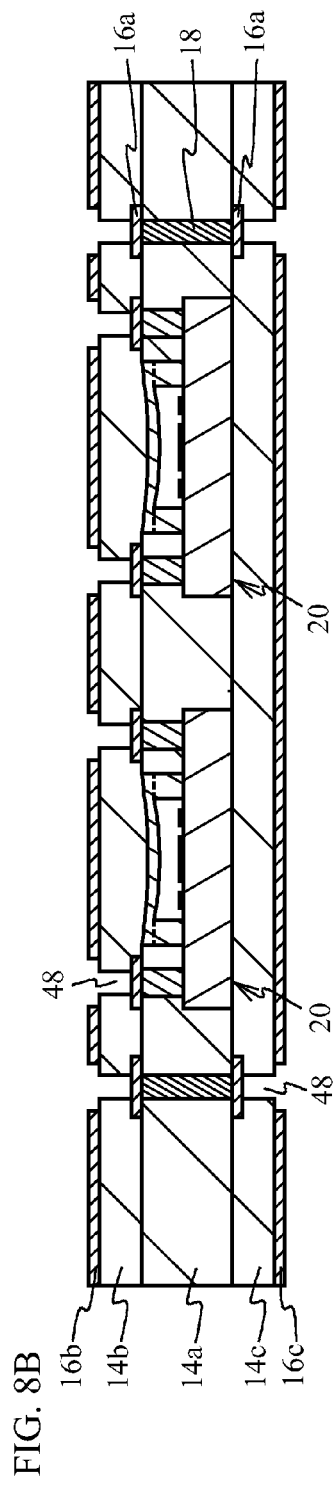

As illustrated in FIG. 8B, apertures are formed in the wiring layers 16b and 16c by using resist layers (not illustrated) formed on the upper surface of the wiring layer 16b and the lower surface of the wiring layer 16c as masks and etching the wiring layers 16b and 16c for example. The insulating layers 14b and 14c are exposed in the apertures. Penetration holes 48 piercing the insulating layers 14b and 14c are formed by irradiating the insulating layers 14b and 14c exposed in the apertures with a laser beam for example. The wiring layer 16a is exposed in the penetration holes 48.

Figure 8C:
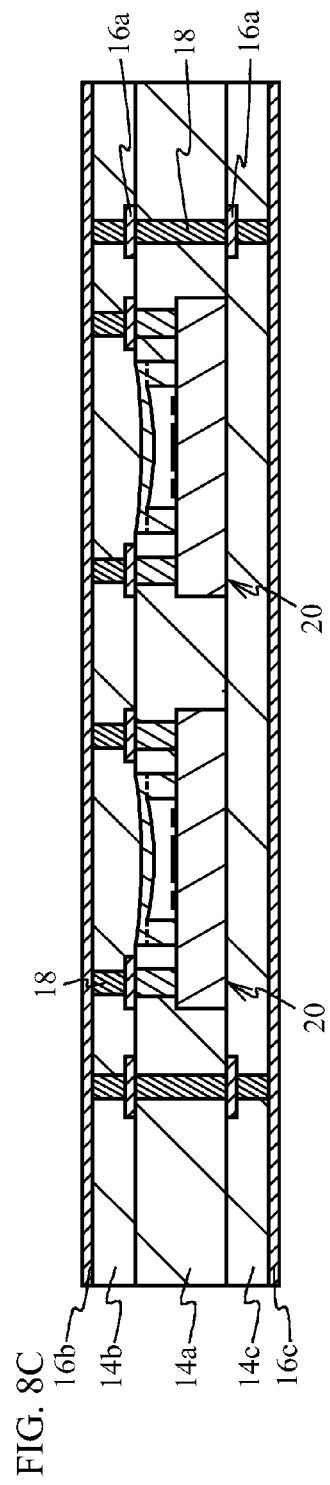

As illustrated in FIG. 8C, the penetrating wiring 18 is formed in the penetration holes 48. The penetrating wiring 18 can be formed by electroless plating that forms a seed metal and electrolytic plating that uses the seed metal as an electrical supply line. Since plated layers are also formed on the upper surface of the insulating layer 14b and the lower surface of the insulating layer 14c, the wiring layers 16b and 16c are formed again on the whole of the upper surface of the insulating layer 14b and the whole of the lower surface of the insulating layer 14c.

Figure 9A:
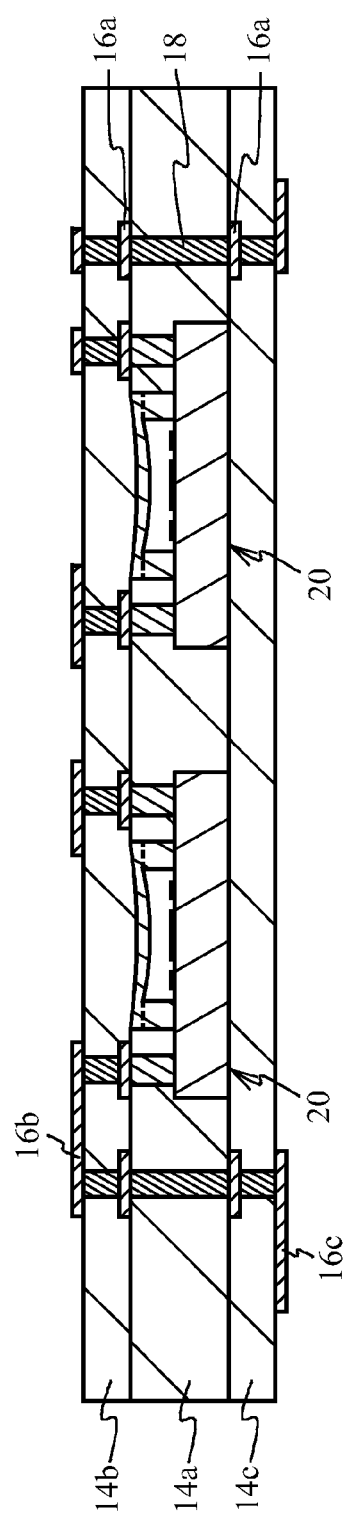
FIG. 9A and FIG. 9B are cross-sectional views (No. 5) illustrating the method of fabricating the acoustic wave device built-in module of the first embodiment.

As illustrated in FIG. 9A, the wiring layers 16b and 16c are patterned into a desired shape by etching the wiring layers 16b and 16c using resist layers (not illustrated) formed on the upper surface of the wiring layer 16b and the lower surface of the wiring layer 16c as masks.

Figure 9B:
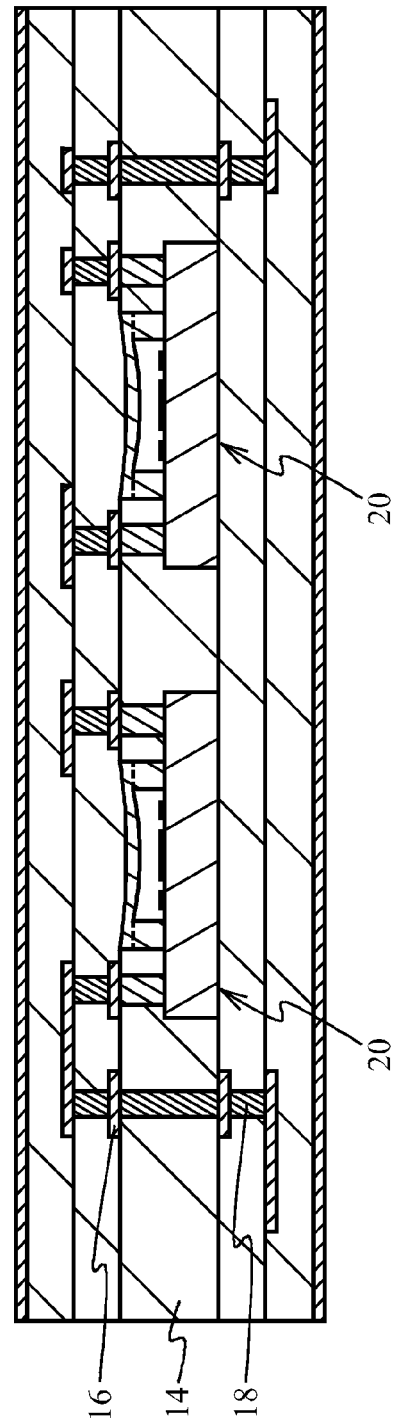

As illustrated in FIG. 9B and FIG. 10A, the same processes as the processes described in FIG. 7 through FIG. 9A are repeated, and the multilayer wiring board 12 in which the acoustic wave device 20 is embedded is formed. Then, the solder 42 is located on the wiring layer 16 on the upper surface of the multilayer wiring board 12 as illustrated in FIG. 10B, and the electronic components 40 to be electrically coupled to the acoustic wave device 20 are mounted by reflow. The above process forms the acoustic wave device built-in module 10 of the first embodiment.

The first embodiment reduces the volume of the air space 30 formed by the sealing portion 28 because the lid 26 constituting the sealing portion 28 of the acoustic wave device 20 embedded in the multilayer wiring board 12 is recessed toward the piezoelectric substrate 22 as illustrated in FIG. 2 and FIG. 4. Thus, the pressure inside the air space 30 increases, and the penetration of moisture into the air space 30 can be suppressed. Therefore, the degradation in characteristics of the acoustic wave device 20 can be suppressed.

To suppress the penetration of moisture into the air space 30, the pressure inside the air space 30 is preferably higher than the pressure inside the air space 30 when the lid 26 is flat. For example, when the curving amount X (recessed amount X) of the lid 26 is greater than or equal to 1% of the height of the air space 30 when the lid 26 is flat, the pressure inside the air space 30 can be increased, and the penetration of moisture can be suppressed. To effectively suppress the penetration of moisture by further increasing the pressure inside the air space 30, the recessed amount X of the lid 26 is preferably greater than or equal to 5% of the height of the air space 30 when the lid 26 is flat. Greater than or equal to 10% is more preferable, and greater than or equal to 20% is further preferable.

Figure 11:
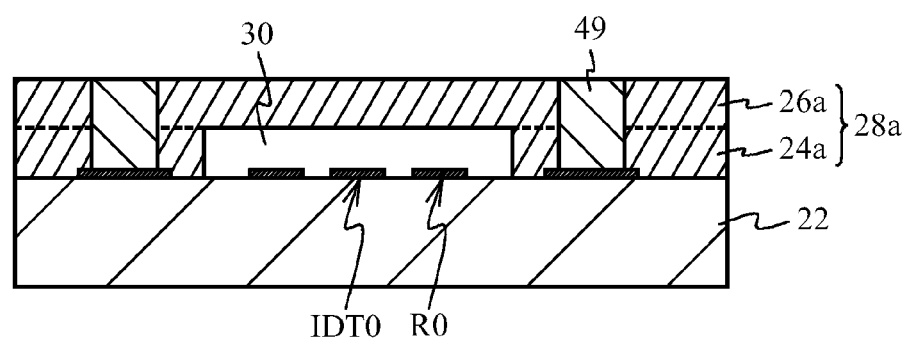
FIG. 11 is a cross-sectional view illustrating a surface acoustic wave device of which a frame body and a lid are formed of an insulating material.

The first embodiment forms the frame body 24 and the lid 26 with a metal, but does not intend to suggest any limitation. The frame body 24 and the lid 26 may be formed of an insulative material such as a resin such as a polyimide or epoxy resin, or a ceramic material. FIG. 11 is a cross-sectional view illustrating a surface acoustic wave device including a frame body and a lid formed of an insulative material. As illustrated in FIG. 11, a frame body 24a made of, for example, a resin is formed so as to surround the IDT0 and the reflectors R0 located on the piezoelectric substrate 22. A lid 26a made of, for example, a resin is formed on the frame body 24a so as to form the air space 30 above the IDT0 and the reflectors R0. This configuration allows the IDT0 and the reflectors R0 to be sealed by a sealing portion 28a including the frame body 24a and the lid 26a. Penetrating electrodes 49 piercing the sealing portion 28a and electrically coupled to the IDT0 are formed. A connecting member is not located between the frame body 24a and the lid 26a, and the frame body 24a is directly bonded to the lid 26a.

The frame body 24 may be formed of a material different from that of the lid 26. For example, the frame body 24 may be formed of a metal, and the lid 26 may be formed of a ceramic material. In addition, the sealing portion 28 may include a member other than the frame body 24 and the lid 26. Further, the sealing portion 28 may be composed of a cap-shaped member integrally formed.

When the strength of the lid 26 is low, a large recess may be formed by the pressure applied for bonding the insulating layer 14b and insulating layer 14c to the insulating layer 14a illustrated in FIG. 7, and the lid 26 may be in contact with the IDT0. In addition, a crack may be formed in the lid 26. Thus, the lid 26 preferably has a certain level of strength, and is preferably formed of a metal. In addition, heat release performance and moisture resistance of the acoustic wave device 20 can be improved by forming the lid 26 with a metal. To improve the heat release performance and moisture resistance, the frame body 24 is preferably also formed of a metal.

When the lid 26 is formed of a metal, the sealing portion 28 is formed by bonding the lid 26 to the frame body 24 with the connecting member 36 made of solder as described with FIG. 5A and FIG. 5B. This boding process is performed under high temperature environment, and thus the inside of the air space 30 is in a decompressed state after the sealing process. When the inside of the air space 30 is in a decompressed state, moisture or the like easily penetrates into the air space 30. Therefore, when the lid 26 is made of a metal, reducing the volume of the air space 30 formed by the sealing portion 28 by recessing the lid 26 toward the piezoelectric substrate 22 compensates the decompression of the inside of the air space 30 in the sealing process, and is effective for suppressing the penetration of moisture.

In addition, when the strength of the lid 26 is higher than requires, the lid 26 is hardly recessed by the pressure applied for bonding the insulating layer 14b and the insulating layer 14c to the insulating layer 14a illustrated in FIG. 7. Therefore, the lid 26 preferably has strength to the extent that the lid 26 is recessed by the pressure applied for bonding the insulating layer 14b and the insulating layer 14c to the insulating layer 14a. As the strength of the lid 26 correlates to the thickness, the lid 26 preferably has a thickness of less than or equal to 10 to 40 μm, more preferably less than or equal to 20 to 30 μm when the lid 26 is made of a metal such as Cu or Ni, an alloy including the metals, or a ceramic material.

The insulating layer 14 constituting the multilayer wiring board 12 may be formed of an insulative material other than a resin, but when the insulating layer 14 is formed of a resin, resin easily absorbs moisture, and thus moisture easily penetrates into the air space 30. Therefore, when the insulating layer 14 is formed of a resin, to increase the pressure inside the air space 30 and suppress the penetration of moisture, the lid 26 is preferably recessed toward the piezoelectric substrate 22.

The recessed amount X of the lid 26 is an amount with which the lid 26 fail to contact with the IDT0, but when the lid 26 is formed of a metal, the gap between the lid 26 and the IDT0 are preferably greater than or equal to 10 μm. This is because characteristics of the acoustic wave device 20 degrade by a capacitance generated between the lid 26 and the IDT0 when the gap between the lid 26 and the IDT0 is small. Thus, the recessed amount X of the lid 26 is selected so as to be less than a half of the thickness of the lid 26 for example. On the other hand, when the lid 26 is formed of an insulative material such as a resin, the lid 26 can be recessed close to the IDT to a position at which it does not interrupt the vibration of the IDT0.

As illustrated in FIG. 2, the acoustic wave device 20 is preferably embedded in the center portion of the multilayer wiring board 12 in the thickness direction. This configuration allows the lid 26 constituting the sealing portion 28 of the acoustic wave device 20 to be easily recessed toward the piezoelectric substrate 22 by the pressure applied for forming the multilayer wiring board 12 by pressure bonding. That is to say, the pressure inside the air space 30 can be easily increased.

Figure 12A:
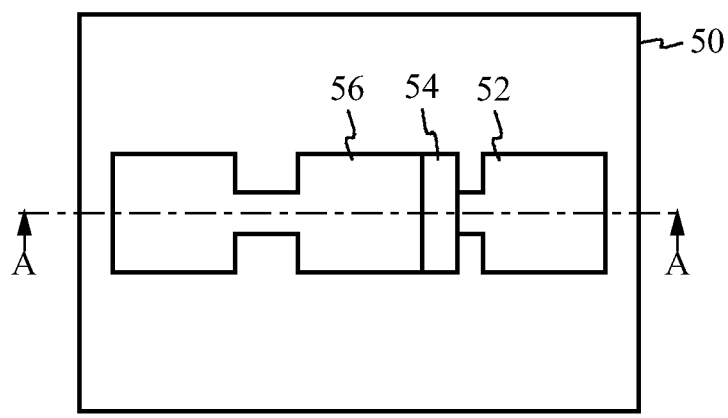
FIG. 12A is a plan view illustrating a piezoelectric thin film resonator device.
Figure 12B:
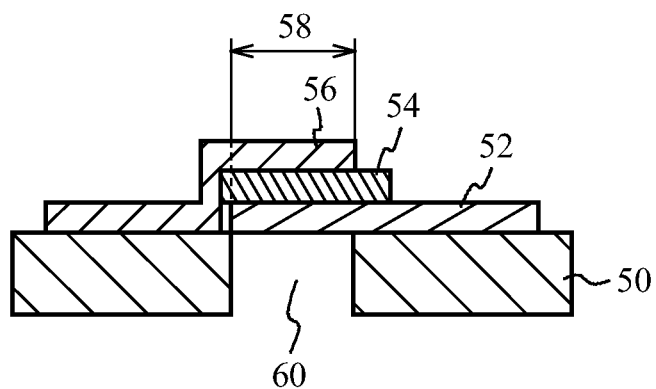
FIG. 12B is a cross-sectional view taken along line A-A in FIG. 12A.

In the first embodiment, the acoustic wave device 20 embedded in the multilayer wiring board 12 is a surface acoustic wave device, but the concept of the present invention can be applied even when the acoustic wave device 20 is a Love wave device or boundary acoustic wave device. The acoustic wave device embedded in the multilayer wiring board may be a piezoelectric thin film resonator device or bulk wave device such as a Lamb wave device. Further, one of the acoustic wave devices embedded in the multilayer wiring board may be a surface acoustic wave device, and another may be a bulk wave device. FIG. 12A is a plan view illustrating a piezoelectric thin film resonator device, and FIG. 12B is a cross-sectional view taken along line A-A in FIG. 12A. As illustrated in FIG. 12A and FIG. 12B, on a substrate 50 such as silicon, stacked are a lower electrode 52, a piezoelectric film 54 such as aluminum nitride, and an upper electrode 56 in this order from the substrate side. A resonance region 58 is a region in which the lower electrode 52 and the upper electrode 56 overlap each other across the piezoelectric film 54. A penetration hole 60 piercing the substrate 50 is formed in the substrate 50 located below the resonance region 58. Instead of the penetration hole 60, an air space may be formed by removing a part of the substrate 50, a dome-shaped air space may be formed between the substrate 50 and the lower electrode 52, or an acoustic multilayered film that reflects an acoustic wave may be formed.

Figure 13:
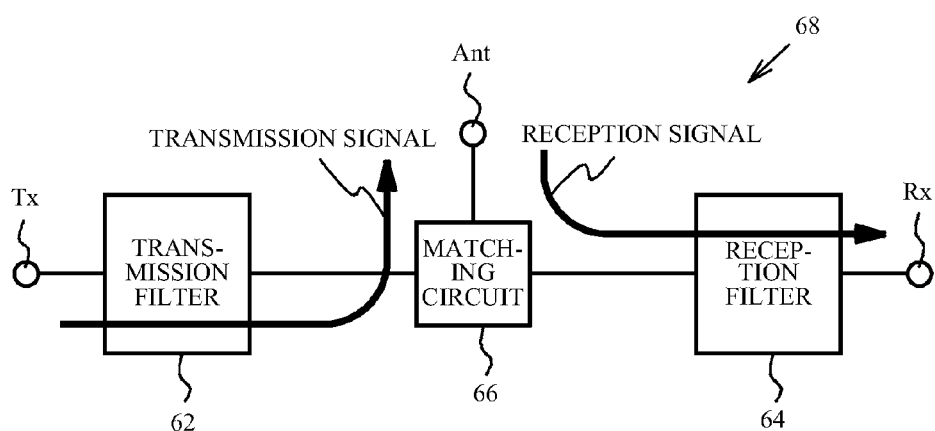
FIG. 13 is a block diagram illustrating a duplexer.

In addition, a duplexer may be formed with the acoustic wave device embedded in a multilayer wiring board. FIG. 13 is a block diagram illustrating a duplexer. As illustrated in FIG. 13, a duplexer 68 includes a transmission filter 62, a reception filter 64, and a matching circuit 66. The transmission filter 62 and the reception filter 64 are formed with the acoustic wave device embedded in the multilayer wiring board. For example, in FIG. 2, one of the acoustic wave devices 20 embedded in the multilayer wiring board 12 may be the transmission filter 62, and the other one may be the reception filter 64. Electrodes exciting an acoustic wave of the filters may be formed on different piezoelectric substrates, or on a single piezoelectric substrate. When they are formed on a single piezoelectric substrate, the electrodes exciting the acoustic wave may be sealed by a single sealing portion.

The transmission filter 62 is located and coupled between an antenna terminal Ant and a transmission terminal Tx. The reception filter 64 is located and coupled between the antenna terminal Ant and a reception terminal Rx. The matching circuit 66 is coupled between at least one of the transmission filter 62 and reception filter 64 and the antenna terminal Ant.

The transmission filter 62 passes signals in the transmission band, out of signals input from the transmission terminal Tx, to the antenna terminal Ant as transmission signals, and suppresses signals with other frequencies. The reception filter 64 passes signals in the reception band, out of signals input from the antenna terminal Ant, to the reception terminal Rx as reception signals, and suppresses signals with other frequencies. The matching circuit 66 is a circuit that matches impedance so that the transmission signal transmitted through the transmission filter 62 is output from the antenna terminal Ant without leaking to the reception filter 64 side.

In the first embodiment, a metal layer such as Cu with a thickness approximately equal to that of the insulating layer 14a may be formed in a peripheral side surface of the insulating layer 14a illustrated in FIG. 6A and FIG. 6B. Such a metal layer can enhance the strength and heat release performance of the multilayer wiring board 12.

Figure 14:
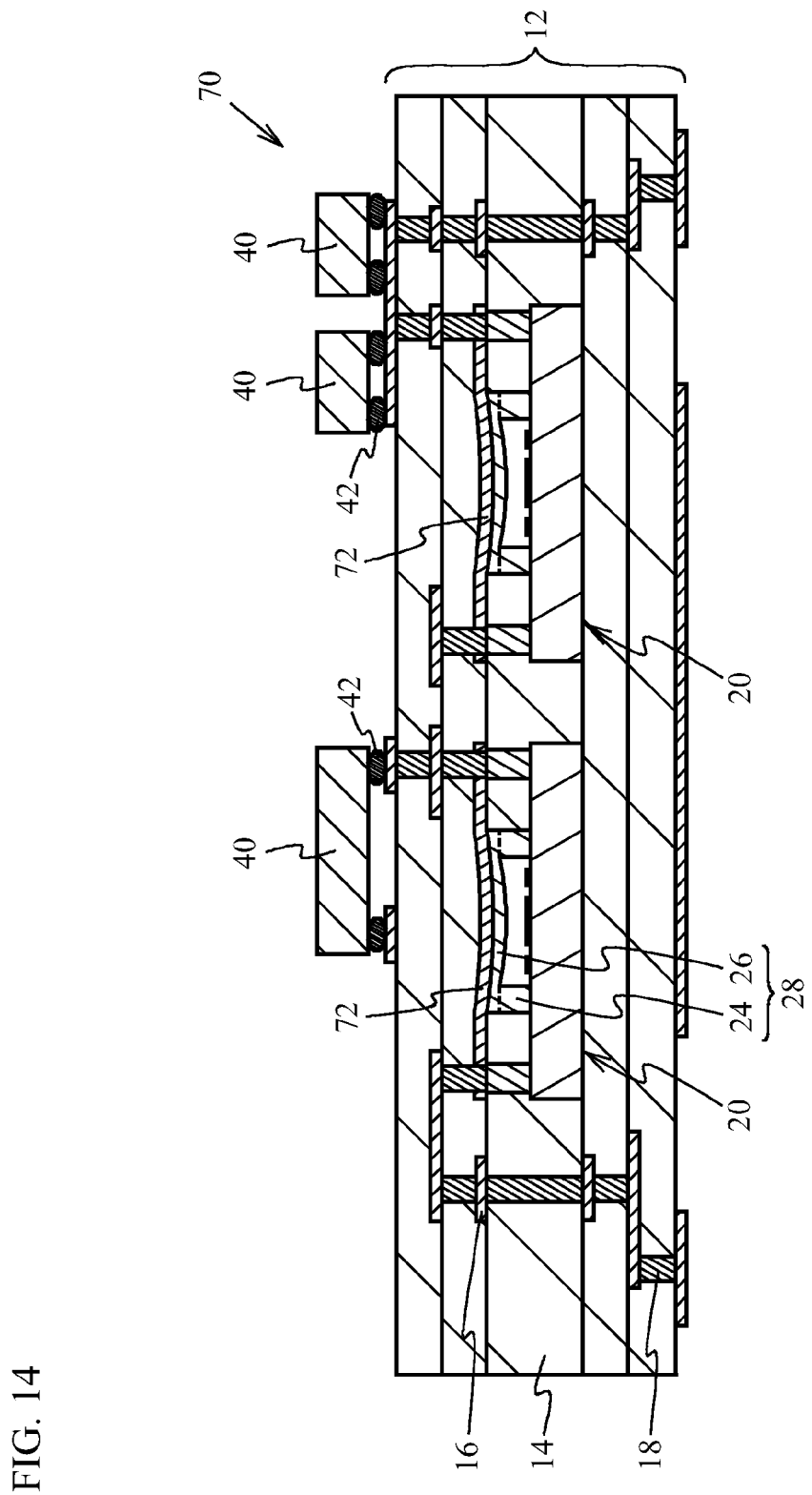
FIG. 14 is a cross-sectional view illustrating an acoustic wave device built-in module in accordance with a first variation of the first embodiment.

FIG. 14 is a cross-sectional view illustrating an acoustic wave device built-in module in accordance with a first variation of the first embodiment. As illustrated in FIG. 14, in an acoustic wave device built-in module 70 of the first variation of the first embodiment, an adjusting layer 72 made of a resin such as a polyimide resin or epoxy resin, or other insulative materials is located on the lid 26 constituting the sealing portion 28. The adjusting layer 72 is formed of an insulative material different from that of the insulating layer 14. Other configuration is the same as the one illustrated in FIG. 2 of the first embodiment, and thus the description thereof is omitted.

The first variation of the first embodiment forms the adjusting layer 72 between the lid 26 and the insulating layer 14. Adjusting the thickness of the adjusting layer 72 enables to adjust the recessed amount of the lid 26 by the pressure applied for bonding the insulating layers 14b and 14c to the insulating layer 14a illustrated in FIG. 7.

For example, when the areas of the lids 26 of the acoustic wave devices 20 embedded in the multilayer wiring board 12 differ from each other, the recessed amounts of the lids 26 of the acoustic wave devices 20 differ from each other even when the same pressure is applied to the acoustic wave devices 20. For example, one of the acoustic wave devices 20 may have the lid 26 hardly recessed, and another one may have the lid 26 recessed enough to contact with the IDT0. However, as described in the first variation of the first embodiment, the adjusting layers 72 are formed on the lids 26 and the thicknesses of the adjusting layers 72 are selected with respect to the acoustic wave devices 20, and thus the recessed amounts of the lids 26 in the acoustic wave devices 20 can be made same as each other.

Second Embodiment

Figure 15:
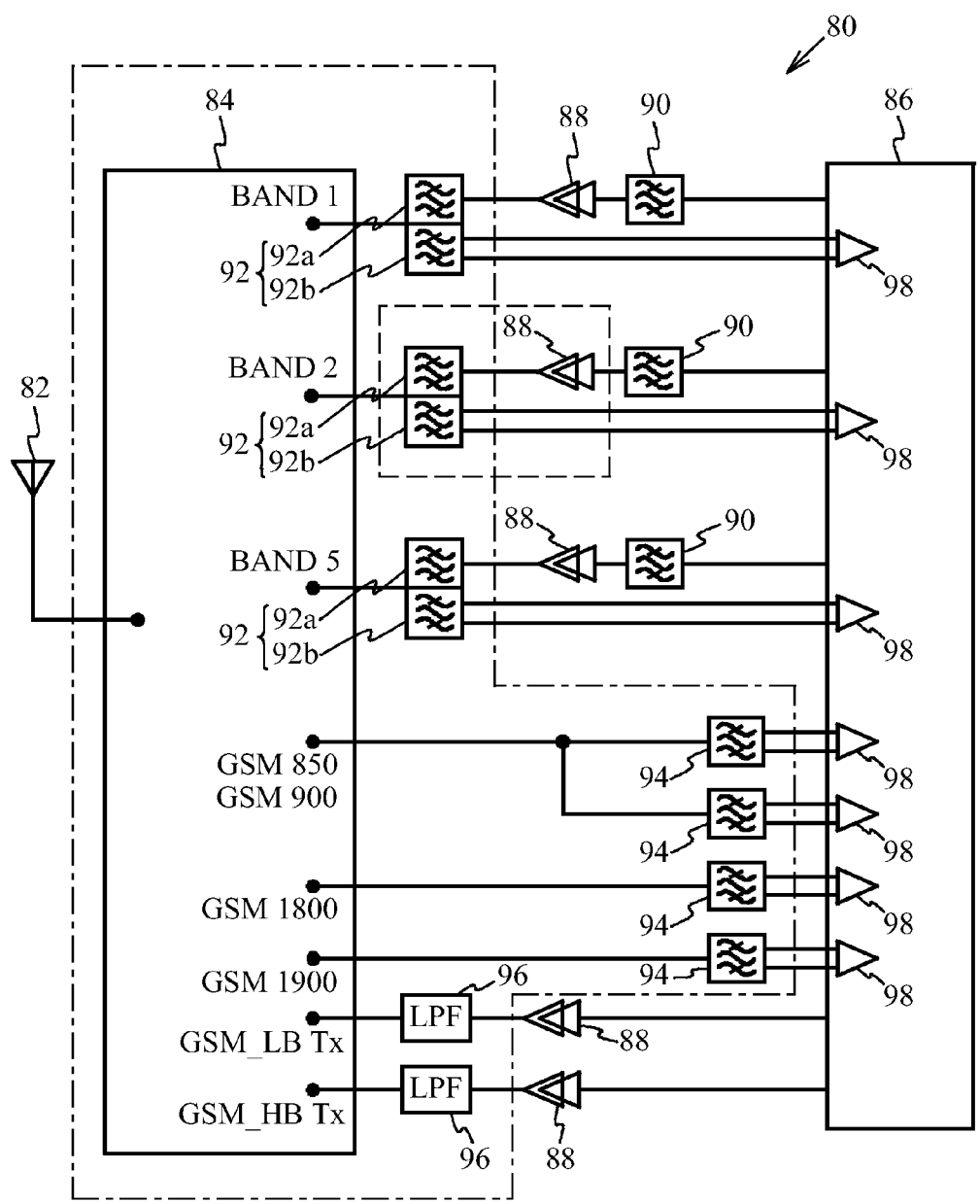
FIG. 15 is a block diagram illustrating a communication device in accordance with a second embodiment.

A second embodiment is an exemplary communication device including the acoustic wave device built-in module of the first embodiment. FIG. 15 is a block diagram illustrating a communication device in accordance with the second embodiment. As illustrated in FIG. 15, a communication device 80 of the second embodiment includes an antenna 82, an antenna switch 84, a high frequency IC 86, power amplifiers 88, filters 90, duplexers 92, reception filters 94, and low-pass filters 96. The high frequency IC 86 includes low noise amplifiers 98. The high frequency IC 86 functions as a direct converter that converts frequencies of signals.

The duplexers 92 support band 1, band 2, and band 5 of W-CDMA (Wideband Code Division Multiple Access). The reception filters 94 supports 850 MHz band, 900 MHz band, 1800 MHz band, and 1900 MHz band of GSM (Global System for Mobile Communication) (registered trademark, as the case may be). One of the low-pass filters 96 has a function of a transmission filter for low bands (850 MHz band and 900 MHz band) of GSM, and the other one has a function of a transmission filter for high bands (1800 MHz band and 1900 MHz band) of GSM.

Transmission filters 92a included in the duplexers 92 are coupled to the high frequency IC 86 through the power amplifiers 88 and the filters 90. The filter 90 is a bandpass filter that selectively passes the band same as the passband of the transmission filter 92a. Reception filters 92b included in the duplexers 92 are coupled to the low noise amplifiers 98 in the high frequency IC 86. The reception filters 94 are coupled to the low noise amplifiers 98 in the high frequency IC 86. The low-pass filters 96 are coupled to the high frequency IC 86 through the power amplifiers 88. The reception filters 92b and the reception filters 94 are not limited to balanced output filters, and may be unbalanced output filters.

The antenna terminals (band 1, band 2, and band 5) of the duplexers 92 are coupled to the antenna switch 84. The antenna terminals (GSM 850, GSM 900, GSM 1800, GSM 1900) of the reception filters 94 are coupled to the antenna switch 84. The antenna terminals (GSM_LB Tx and GSM_HB Tx) of the low-pass filters 96 are coupled to the antenna switch 84.

The antenna switch 84 selects one of the duplexers and the filters in accordance with a communication method, and connects it to the antenna 82. For example, the high frequency IC 86 generates transmission signals by up-converting a baseband signal to an RF signal of band 5 of W-CDMA. The transmission signal is filtered by the filter 90, amplified by the power amplifier 88, and filtered again by the duplexer 92 for band 5. The transmission signal is transmitted through the antenna 82. A reception signal of band 5 of W-CDMA received by the antenna 82 is filtered by the duplexer 92 for band 5. The low noise amplifier 98 amplifies the reception signal, and the high frequency IC 86 down-converts the reception signal to the baseband signal.

The acoustic wave device built-in module 10 of the first embodiment may have various configurations: for example, it may include components surrounded by a dashed line in FIG. 15 (one duplexer 92 and one power amplifier 88), or components surrounded by a chain line (antenna switch 84, duplexers 92, reception filters 94, and low-pass filters 96).

Although the embodiments of the present invention have been described in detail, it is to be understood that the various change, substitutions, and alterations could be made hereto without departing from the spirit and scope of the invention.

What is claimed is:

1. An acoustic wave device built-in module comprising:
   a multilayer wiring board formed by stacking an insulating layer and a wiring layer;
   an acoustic wave device embedded in the multilayer wiring board; and
   an electronic component located on the multilayer wiring board and electrically coupled to the acoustic wave device, wherein
   the acoustic wave device includes:
      an electrode that is located on a substrate and excites an acoustic wave; and
      a sealing portion that includes a frame body located on the substrate so as to surround the electrode and a lid located on the frame body so as to form an air space above the electrode, and
   a center portion of the lid is recessed downwardly toward the substrate relative to a peripheral portion of the lid.

2. The acoustic wave device built-in module according to claim 1, wherein
   the insulating layer is formed of a resin.

3. The acoustic wave device built-in module according to claim 1, wherein
the lid is formed of a metal.

4. The acoustic wave device built-in module according to claim 3, wherein
a recessed amount of the lid is less than a half of a thickness of the lid.

5. The acoustic wave device built-in module according to claim 3, wherein
an insulating material is located between the lid and the insulating layer.

6. The acoustic wave device built-in module according to claim 1, wherein
the acoustic wave device is embedded in a center portion of the multilayer wiring board in a thickness direction.

7. The acoustic wave device built-in module according to claim 1 wherein
the acoustic wave device includes a surface acoustic wave device.

8. The acoustic wave device built-in module according to claim 1, wherein
the acoustic wave device includes a bulk wave device.

9. The acoustic wave device built-in module according to claim 1, wherein
the acoustic wave device forms a duplexer.

10. A communication device comprising:
an acoustic wave device built-in module according to claim 1.

11. The acoustic wave device built-in module according to claim 1, wherein an upper surface of the lid is in direct contact with the insulating layer.

12. The acoustic wave device built-in module according to claim 1, wherein the center portion of the lid is curved toward the substrate.

* * * * *